(12) United States Patent
Yamada et al.

(10) Patent No.: US 8,372,686 B2
(45) Date of Patent: Feb. 12, 2013

(54) METHOD FOR PRODUCING AN ORGANIC THIN FILM TRANSISTOR AND AN ORGANIC THIN FILM TRANSISTOR PRODUCED BY THE METHOD

(75) Inventors: Jun Yamada, Ibaraki (JP); Yuya Hirao, Ritto (JP); Naoki Masazumi, Kobe (JP)

(73) Assignee: Konica Minolta Holdings, Inc., Tokyo (JP)

( * ) Notice: Subject to any disclaimer, the term of this patent is extended or adjusted under 35 U.S.C. 154(b) by 733 days.

(21) Appl. No.: 11/714,059

(22) Filed: Mar. 5, 2007

(65) Prior Publication Data
US 2007/0212807 A1    Sep. 13, 2007

(30) Foreign Application Priority Data

Mar. 7, 2006  (JP) .................................. 2006-60760
Feb. 2, 2007  (JP) .................................. 2007-24031

(51) Int. Cl.
*H01L 21/00*    (2006.01)
(52) U.S. Cl. .......................................... 438/99; 257/72
(58) Field of Classification Search .................... 438/99; 257/72
See application file for complete search history.

(56) References Cited

U.S. PATENT DOCUMENTS

| | | | |
|---|---|---|---|
| 3,600,642 A * | 8/1971 | Allison et al. | 257/343 |
| 6,913,944 B2 * | 7/2005 | Hirai | 438/99 |
| 7,038,278 B2 | 5/2006 | Tsujimura et al. | |
| 7,116,318 B2 | 10/2006 | Amundson et al. | |
| 7,170,088 B2 * | 1/2007 | Koo et al. | 257/40 |
| 7,253,882 B2 * | 8/2007 | Ozaki et al. | 355/67 |
| 7,605,799 B2 | 10/2009 | Amundson et al. | |
| 8,077,266 B2 | 12/2011 | Nakamura et al. | |
| 2003/0010287 A1 * | 1/2003 | Banno et al. | 118/688 |
| 2003/0222315 A1 | 12/2003 | Amundson et al. | |
| 2004/0036072 A1 | 2/2004 | Tsujimura et al. | |
| 2005/0056847 A1 * | 3/2005 | Nakamura et al. | 257/72 |
| 2005/0269562 A1 * | 12/2005 | Yang et al. | 257/40 |

(Continued)

FOREIGN PATENT DOCUMENTS

| | | |
|---|---|---|
| JP | 2004-087682 A | 3/2004 |
| JP | 2004-221562 | 8/2004 |

(Continued)

OTHER PUBLICATIONS

Japanese Office Action corresponding to Japanese patent application No. 2007-024031, 2007.

*Primary Examiner* — Kimberly Rizkallah
*Assistant Examiner* — Caleb Henry
(74) *Attorney, Agent, or Firm* — Brinks, Hofer, Gilson & Lione

(57) ABSTRACT

A method for producing an organic thin film transistor having, on a substrate, a source electrode, a gate electrode, a drain electrode, an insulating layer and an organic semiconductor layer. The method has a step of forming the source electrode and the drain electrode such that one of the source electrode and the drain electrode which is an inner-located electrode has an outer circumference which is circular or polygonal and that the other electrode which is an outer-located electrode has an inner circumference facing the outer circumference of the inner-located electrode, the inner circumference being of a shape which is substantially concentric with the outer circumference of the inner-located electrode. The method also has a step of forming the organic semiconductor layer for connecting the source electrode and the drain electrode to each other by a process of dropping an organic semiconductor material.

26 Claims, 11 Drawing Sheets

U.S. PATENT DOCUMENTS

| | | |
|---|---|---|
| 2005/0274953 A1* | 12/2005 | Kim et al. ................ 257/66 |
| 2006/0102897 A1* | 5/2006 | Suh et al. ................ 257/40 |
| 2007/0035532 A1 | 2/2007 | Amundson et al. |
| 2009/0315044 A1 | 12/2009 | Amundson et al. |

FOREIGN PATENT DOCUMENTS

| | | |
|---|---|---|
| JP | 2005-084416 A | 3/2005 |
| JP | 2005-093633 A | 4/2005 |
| JP | 2005-524110 A | 8/2005 |
| JP | 2006-286718 A | 10/2006 |
| JP | 2006-286772 A | 10/2006 |
| JP | 2006-286773 A | 10/2006 |
| JP | 2007-012669 A | 1/2007 |
| WO | WO 03/092077 A2 | 11/2003 |

* cited by examiner (X-X' sectional view in FIG. 2a-1)

(Y-Y' sectional view)

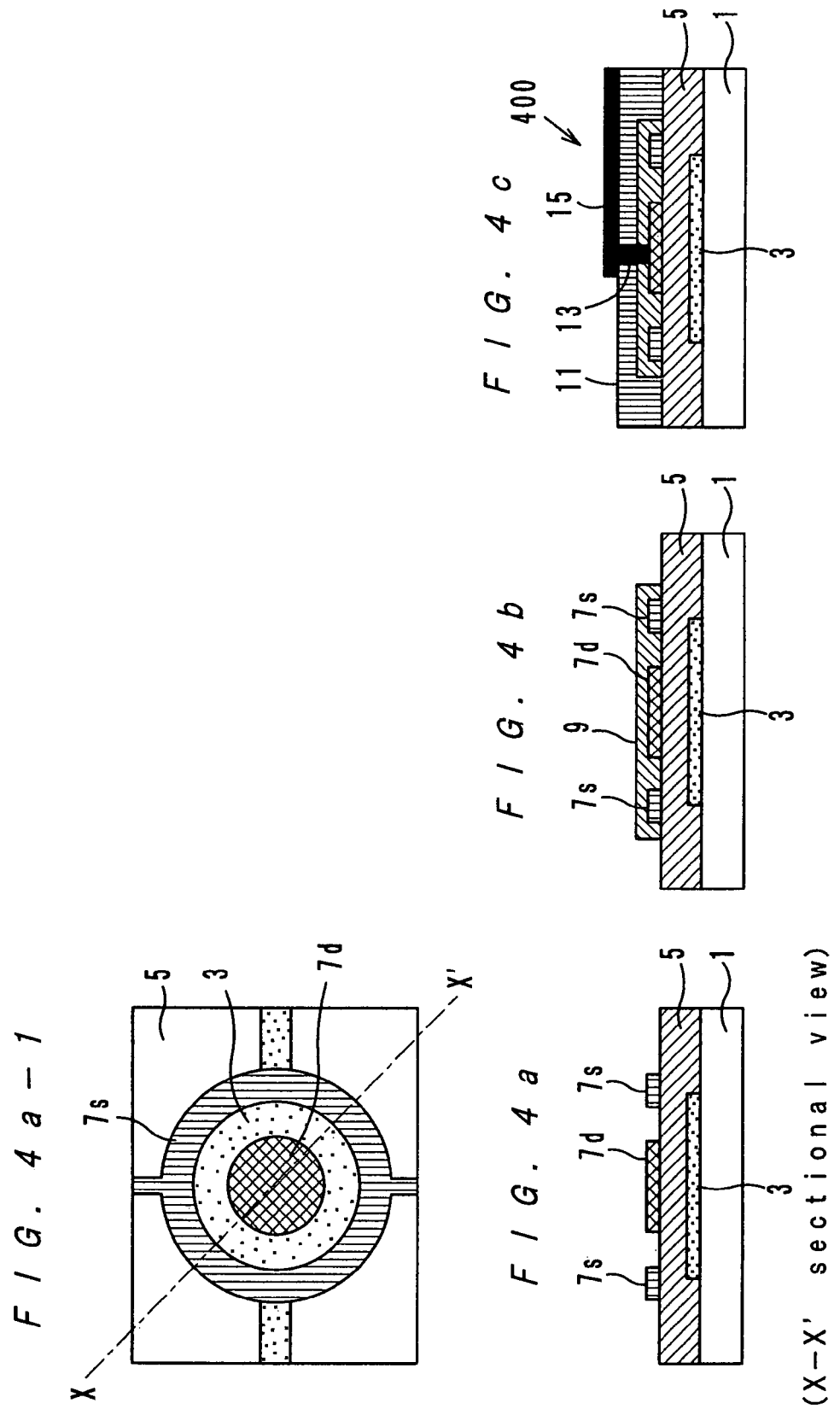

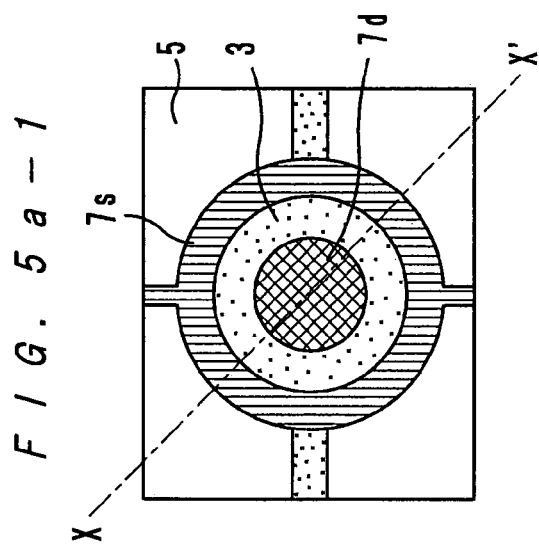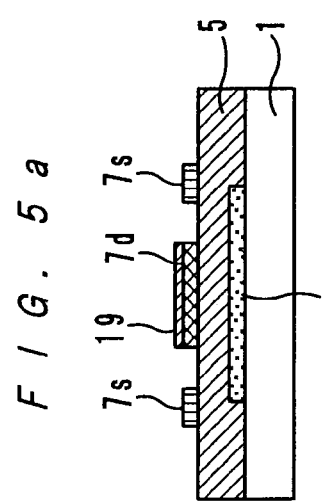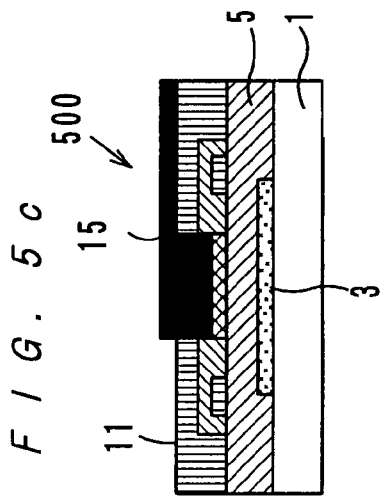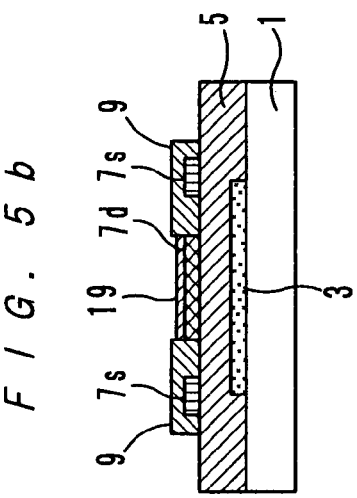

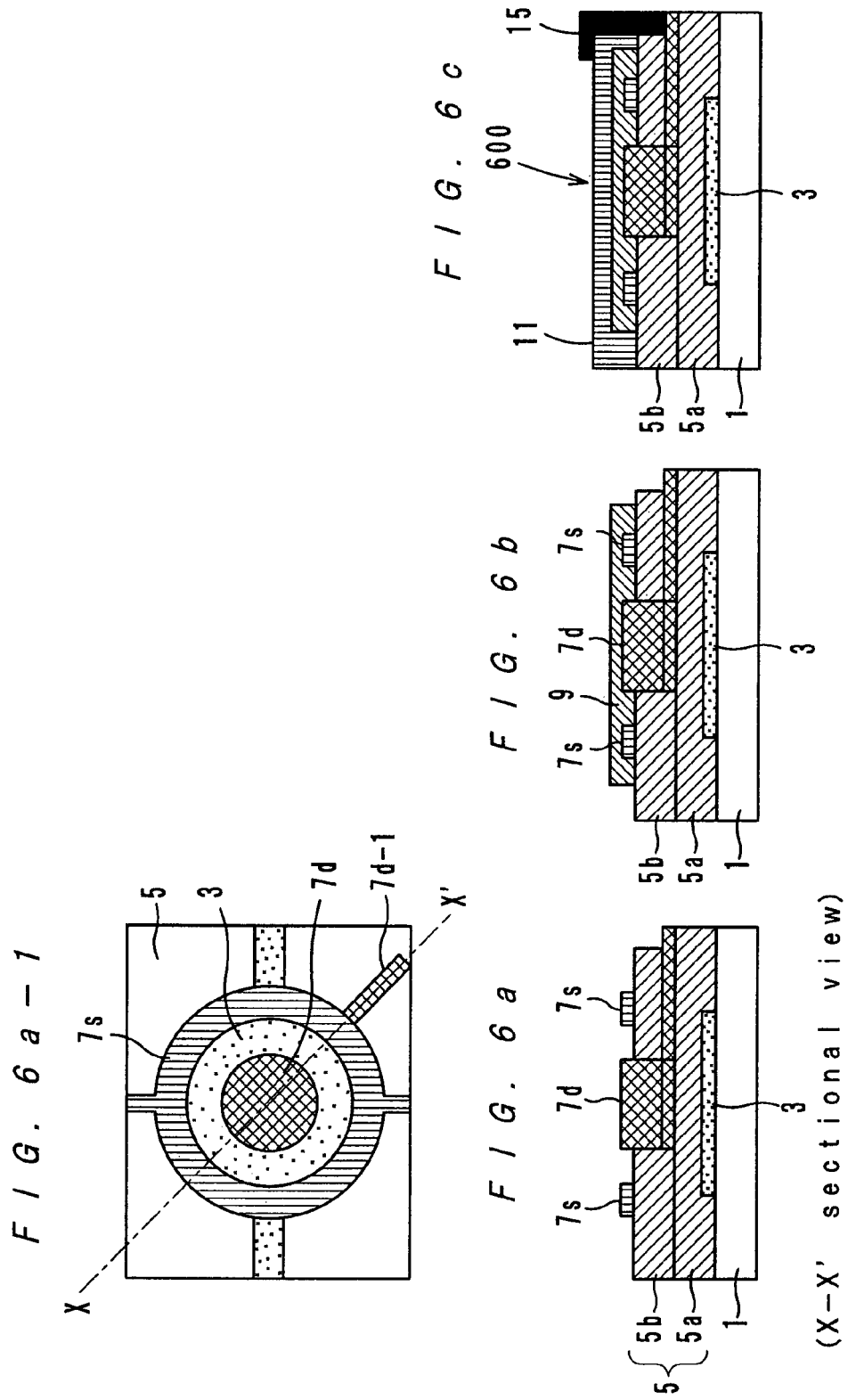

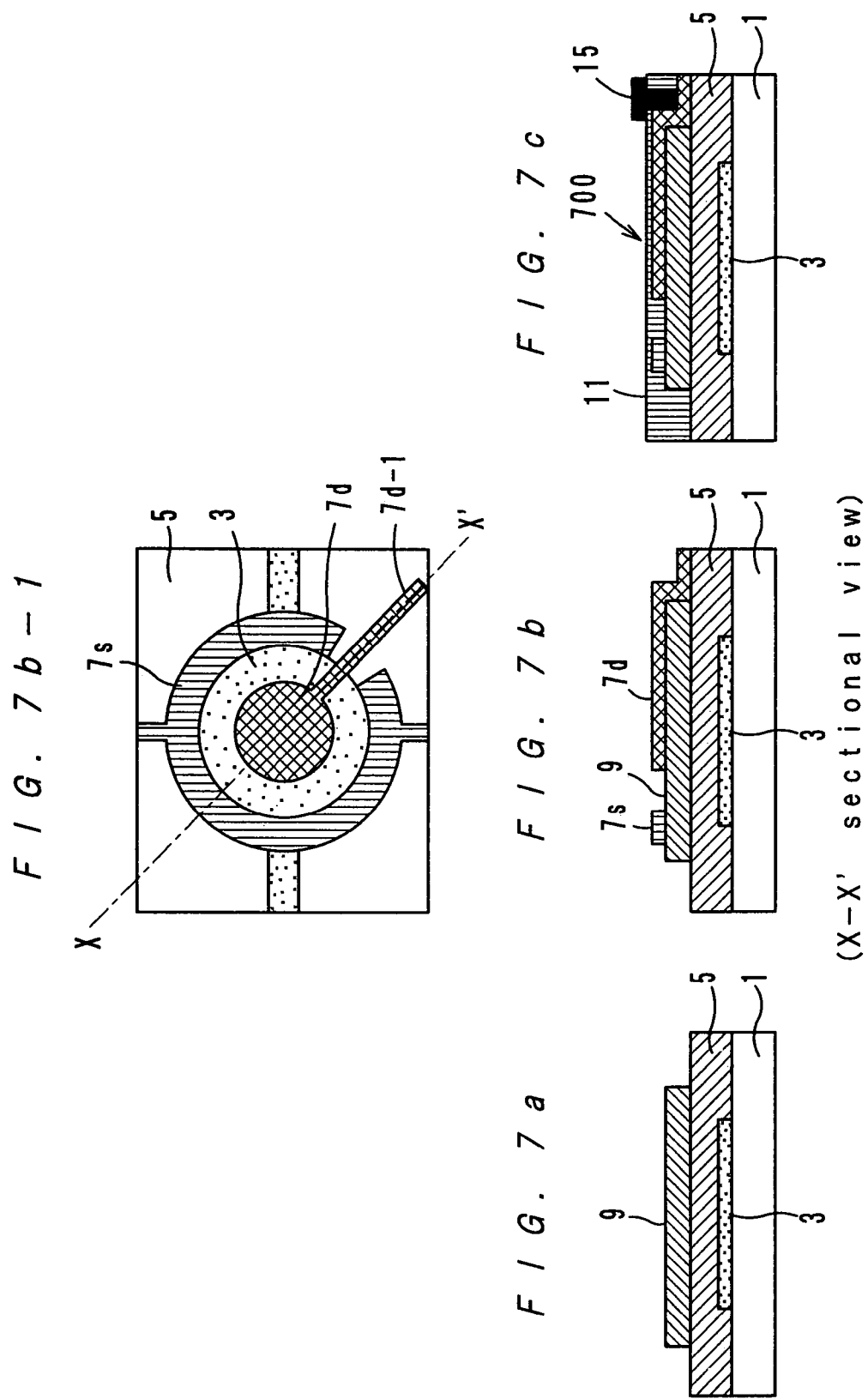

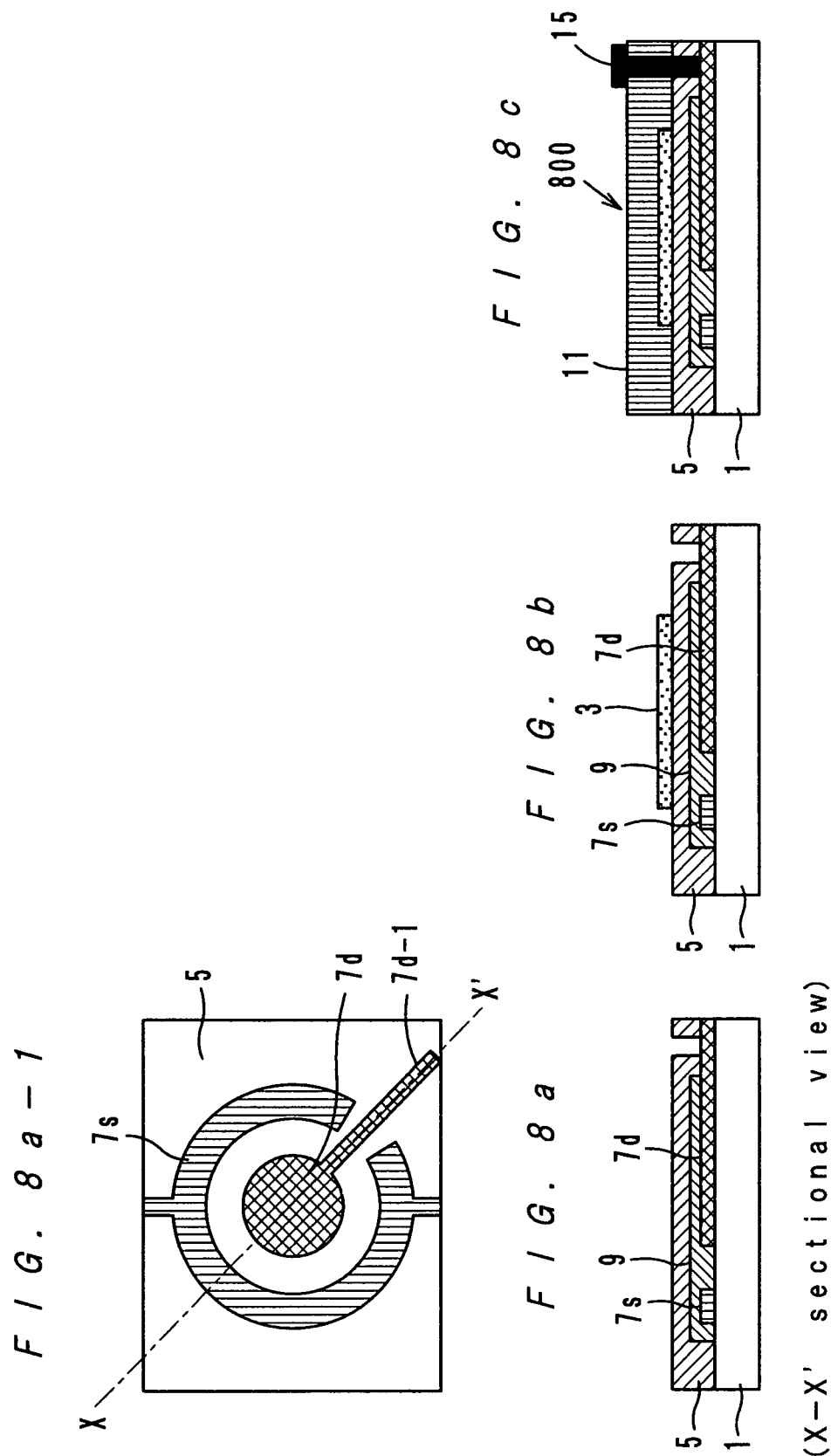

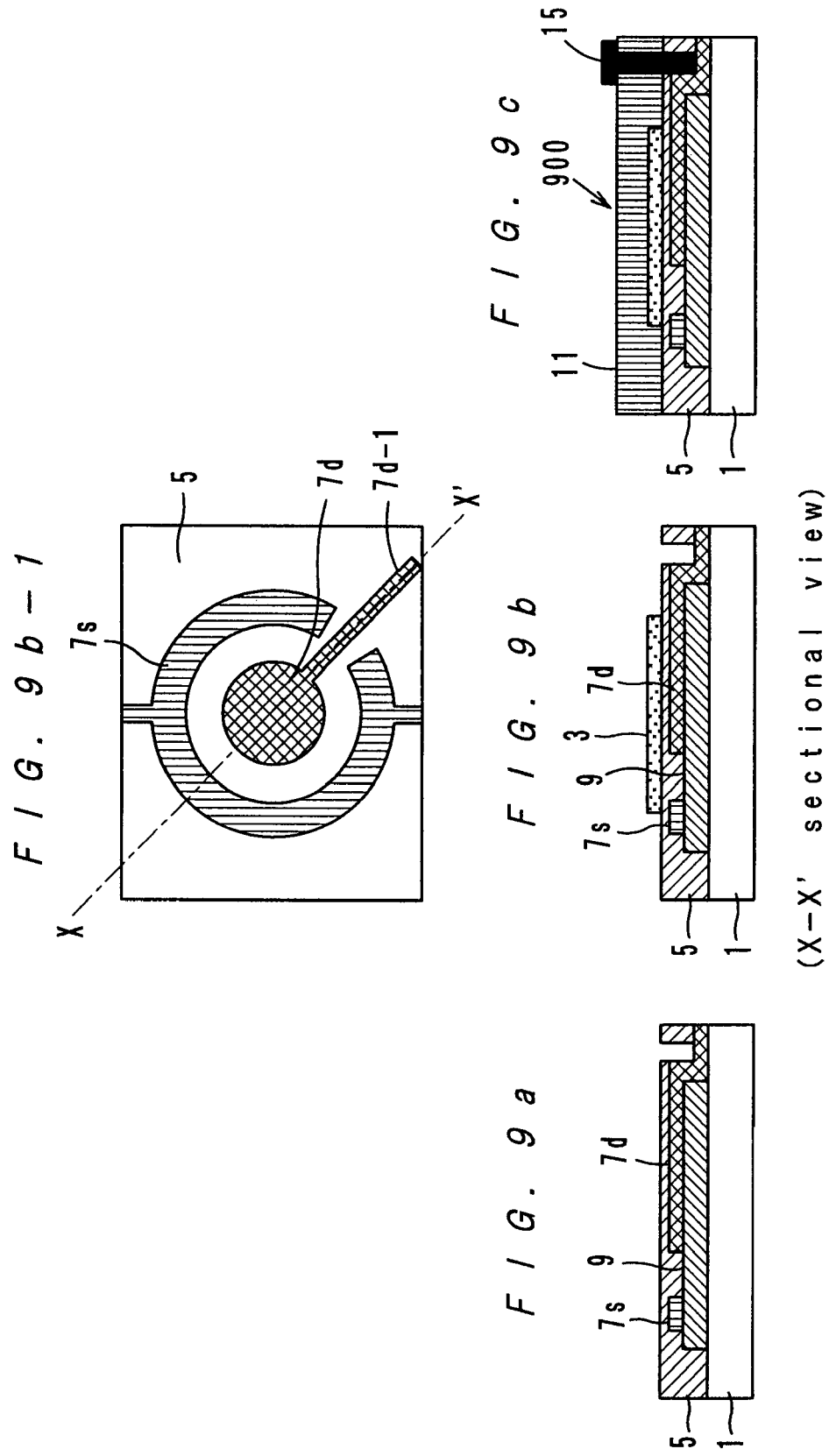

(X-X' sectional view)

(X-X' sectional view)

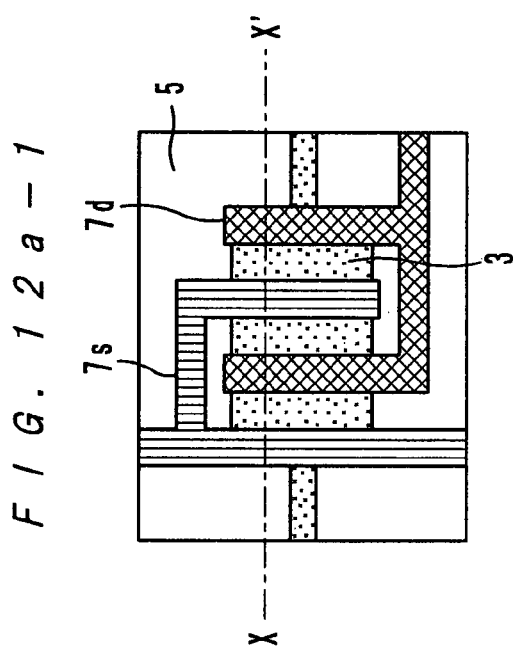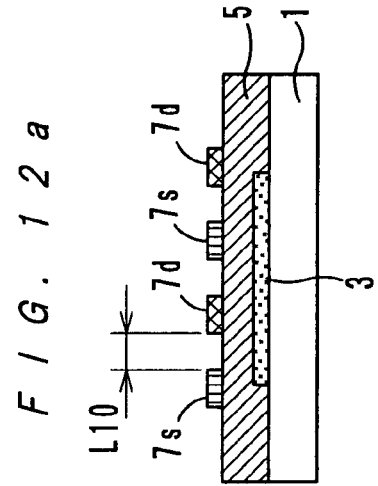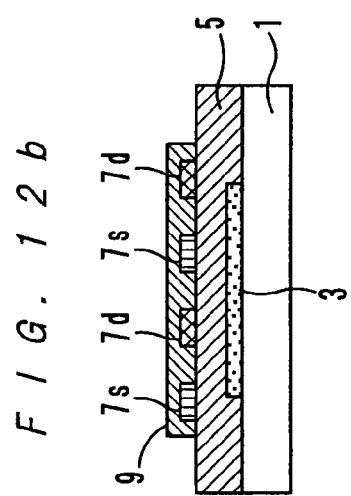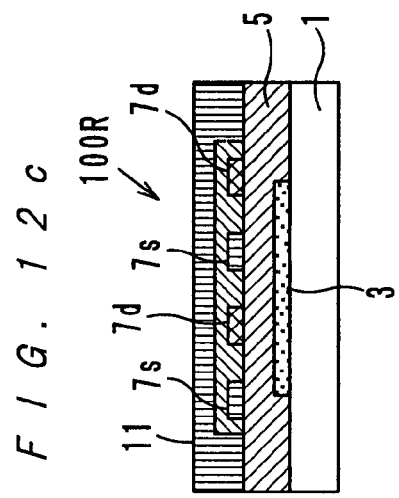

METHOD FOR PRODUCING AN ORGANIC THIN FILM TRANSISTOR AND AN ORGANIC THIN FILM TRANSISTOR PRODUCED BY THE METHOD

This application is based on Japanese Patent Application Nos. 2006-60760 and 2007-24031, the contents of which are incorporated herewith by reference.

BACKGROUND OF THE INVENTION

1. Field of the Invention

The present invention relates to a method for producing an organic thin film transistor and an organic thin film transistor produced by the method.

2. Description of Related Art

Recently, as switching elements for driving pixels of a flat panel display device and an electronic paper, which are next-generation high-quality low-price devices, organic thin film transistors (OTFTs) draw attention.

An organic thin film transistor is basically of the same structure as that of a silicon thin film transistor. However, while the silicon thin film transistor has a semiconductor active layer made of silicon, the organic thin film transistor has a semiconductor active layer made of an organic material. Such organic thin film transistors can be produced by an ink jet process, a printing process or the like without using a vacuum device, and accordingly can be produced easily and at low cost, compared with silicon thin film transistors. Also, the organic thin film transistors have advantages that they are not broken easily by an impact and that they bend and fold easily, and the organic thin film transistors are suited to be used for an electronic circuit board. Also, when elements must be arranged in a large area and when a process is performed under low temperature, using the organic thin film transistors is effective. Therefore, the organic thin film transistors are expected to be used as matrix driving elements of a large display, driving elements of an organic EL and driving elements of an electric paper, and many makers have been developing organic thin film transistors.

Conventionally, a film pattern of a semiconductor element is formed by photolithography and etching in the following way. A resist is coated entirely on a substrate, and the substrate is pre-baked. Thereafter, the substrate is irradiated with ultraviolet rays via a photo-mask, and a resist pattern is formed by development. Then, etching is performed by using the resist pattern as a mask so that a film (made of a semiconductor material, an insulating material or a conductor material) in an unnecessary part can be removed. Thus, a film pattern is formed.

In a production process of an organic thin film transistor with a patterned organic semiconductor layer, patterning of the organic semiconductor layer is possible by the above-described conventional photolithography and etching, but as mentioned, it is easier to perform patterning by a printing process or an ink jet process. In these processes, the ink jet process is a process wherein an arbitrary pattern can be formed without a mask and an organic semiconductor material needs to be coated only on necessary parts, that is, an organic semiconductor material can be used efficiently (refer to, for example, Japanese Patent Laid-Open Publication No. 2004-221562 (Reference 1)).

The reference 1 says that the pattern to be formed by the ink jet process may be of any shape and describes a dot pattern as an example. The reference 1 also says that masking may be performed. However, the reference 1 is silent about the specific shape of an electrode on which a semiconductor material is to be dropped and the details of dropping.

When an organic semiconductor layer is formed by dropping, the organic semiconductor layer must be formed into a shape matching with the shape of an electrode on which the semiconductor layer is to be formed. In order to form an organic semiconductor layer in the desired shape more exactly, it is necessary to make more drops by use of a dropping device with smaller nozzles. As the number of drops is increasing, the time for dropping becomes longer, which causes a problem that the productivity becomes lower. Also, a semiconductor layer formed of a large number of drops has unevenness in the layer thickness due to overlap of drops. This may change the characteristics, which may cause trouble.

SUMMARY OF THE INVENTION

The present invention has been made in view of the above-described problems. It is an object of the present invention to provide a method for efficiently producing an organic thin film transistor with a good performance and an organic thin film transistor produced by the method.

The present invention, in a first aspect, provides a method for producing an organic thin film transistor comprising, on a substrate, a source electrode, a gate electrode, a drain electrode, an insulating layer and an organic semiconductor layer, said method comprising the steps of: forming the source electrode and the drain electrode such that one of the electrodes which is an inner-located electrode has an outer circumference which is circular or polygonal and that the other electrode which is an outer-located electrode has an inner circumference facing the outer circumference of the inner-located electrode, the inner circumference being of a shape which is substantially concentric with the outer circumference of the inner-located electrode; and forming the organic semiconductor layer for connecting the source electrode and the drain electrode to each other by a process of dropping an organic semiconductor material.

In a second aspect, the present invention provides a method for producing an organic thin film transistor comprising, on a substrate, a source electrode, a gate electrode, a drain electrode, an insulating layer and an organic semiconductor layer, said method comprising the steps of: forming the organic semiconductor layer by a process of dropping an organic semiconductor material; and forming the source electrode and the drain electrode such that one of the electrodes which is an inner-located electrode has an outer circumference which is circular or polygonal, that the other electrode which is an outer-located electrode has an inner circumference facing the outer circumference of the inner-located electrode, the inner circumference being of a shape which is substantially concentric with the outer circumference of the inner-located electrode and that the source electrode and the drain electrode are connected to each other by the organic semiconductor layer.

In both the methods above, the dropping process performed in the organic semiconductor layer forming step is preferably an ink jet process. In the dropping process, also, preferably one drop is applied.

The methods further may comprise a step of forming a protection layer for protecting the organic semiconductor layer. Moreover, the methods may comprise a step of forming a contact hole which pierces through the protection layer.

By either of the methods according to the present invention, an organic thin film transistor wherein a source electrode and a drain electrode has an outer circumference and an inner circumference facing each other and wherein an organic semiconductor layer is formed by dropping of an organic semiconductor material. The outer circumference of either the source electrode or the drain electrode which is an inner-located electrode and the inner circumference of the other (an outer-located) electrode are circular or polygonal substantially in concentric with each other. The organic semiconductor layer is formed such that the organic semiconductor layer connects the source electrode and the drain electrode to each other. The organic semiconductor material is dropped onto the center of the circular or polygonal inner-located electrode, and the dropped material spreads radially and reaches the outer-located electrode. Thus, an organic semiconductor layer with an even thickness can be formed.

The dropping process for forming the organic semiconductor layer may be an ink jet process. In the ink jet process, dropping is easy to control, and the volume of the organic semiconductor material to be dropped can be regulated.

Thus, the organic semiconductor layer can be formed by applying one drop of an organic semiconductor material by an ink jet process, and the organic semiconductor layer has an alignment in a direction matching with a channel width which is formed on the organic semiconductor layer by the source electrode and the drain electrode. Therefore, an organic thin film transistor produced by either of the methods will have a good performance.

Thus, the methods permit efficient production of an organic thin film transistor with a good performance.

BRIEF DESCRIPTION OF THE DRAWINGS

This and other objects and features of the present invention will be apparent from the following description with reference to the accompanying drawings, in which:

FIGS. 4a-1, 4a, 4b and 4c are illustrations showing a structure of an OTFT of a first example and processes for producing the OTFT;

FIGS. 5a-1, 5a, 5b and 5c are illustrations showing a structure of an OTFT of a second example and processes for producing the OTFT;

FIGS. 6a-1, 6a, 6b and 6c are illustrations showing a structure of an OTFT of a third example and processes for producing the OTFT;

FIGS. 7b-1, 7a, 7b and 7c are illustrations showing a structure of an OTFT of a fourth example and processes for producing the OTFT;

FIGS. 8a-1, 8a, 8b and 8c are illustrations showing a structure of an OTFT of a fifth example and processes for producing the OTFT;

FIGS. 9b-1, 9a, 9b and 9c are illustrations showing a structure of an OTFT of a sixth example and processes for producing the OTFT;

FIGS. 10a-1 and 10a are views of an OTFT of a bottom gate and bottom contact type according to another embodiment;

FIGS. 11a-1 and 11a are views of an OTFT of a bottom gate and bottom contact type according to another embodiment; and FIGS. 12a-1, 12a, 12b and 12c are views showing a structure of an OTFT of a control example used for a control experiment, in which the OTFT of the first example and the OTFT of the control example are compared with each other, and processes for producing the OTFT of the control example.

DETAILED DESCRIPTION OF THE PREFERRED EMBODIMENTS

Preferred embodiments of a method for producing an organic thin film transistor and an organic thin film transistor produced by the method according to the present invention will be described with reference to the accompanying drawings. An organic thin film transistor (which will be referred to as an OTFT) according to the present invention comprises, on a substrate, a gate electrode, a sauce electrode, a drain electrode, a gate insulator and an organic semiconductor. According to the arrangement of the gate electrode, the sauce electrode, the drain electrode, the gate insulator and the organic semiconductor, the OTFT can be structured into one of a bottom gate bottom contact type, a bottom gate top contact type, a top gate bottom contact type and a top gate top contact type. In the following, the structure, the material and the forming method, etc. of each part will be described with reference to FIGS. 1a-1g showing a production process of an OTFT 100.

Figure 1A:
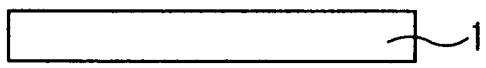
FIGS. 1a-1g are sectional views showing processes for producing an OTFT of a bottom gate bottom contact type according to an embodiment.

A substrate 1 shown by FIG. 1a, on which the OTFT 100 is to be formed, may be of any material, and the substrate 1 may be, for example, a glass plate, a flexible plastic film or the like. The plastic film may be specifically a film of polyethylene terephthalate, polyethylene naphthalate, polyether sulfone, polyether imido, polyether ether ketone, polyphenylene sulfide, polyallylate, polyimide, polycarbonate, cellulose triacetate, cellulose acetate propionate or the like. In a case of using such a plastic film, compared with a case of using a glass plate, the substrate 1 is lighter, more portable and more resistant to an impact.

Figure 1B:
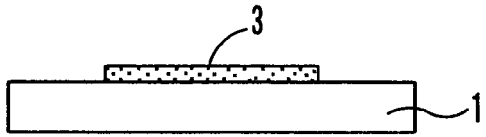

On the substrate 1, a circular gate electrode 3 is formed (see FIG. 1b). Specifically, first, a conductive thin film (not shown) is formed. The conductive thin film is of any material as long as the material is electrically conductive, and preferably, a metal material which guarantees sufficient conductivity, such as Al, Cr, Ag, Mo or the like, is used.

The conductive thin film is formed of such a material by conventional evaporation, sputtering or the like. Thereafter, the conductive thin film is patterned by conventional photolithography (resist coating, exposure and development) and etching, and in this way, the gate electrode 3 is formed.

Figure 1C:
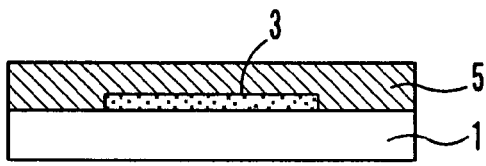

Next, a gate insulating film 5 to cover the gate electrode 3 is formed (see FIG. 1c). The gate insulating film 5 is formed after formation of the gate electrode 3. The material of the gate insulator 5 is not particularly limited, and various insulating materials can be used. Preferably, a film of inorganic oxide with a high dielectric constant is used. The inorganic oxide is specifically silicon oxide, aluminum oxide, tantalum oxide, titanium oxide or the like. Further, inorganic nitride, such as silicon nitride, aluminum nitride, etc., is suited for the insulating film 5.

The insulating film 5 may be formed by a dry process or a wet process. The dry process may be vacuum evaporation, molecular beam epitaxy, an ion-cluster beam process, a low-energy ion beam process, ion plating, CVD, sputtering, an atmospheric pressure plasma process, etc. The wet process may be coating, such as spray coating, spin coating, blade coating, dip coating, casting, roll coating, bar coating, die coating, etc., and patterning by printing or an ink-jet process, etc.

The wet process may be performed by coating a liquid wherein fine particles of inorganic oxide are dispersed in an arbitrary organic solvent or water by using a dispersion adjuvant, such as a surface active agent, if necessary and by drying the liquid. Also, as the wet process, a solution of a precursor of oxide, for example, alkoxide may be coated and dried, that is, a sol-gel method may be performed.

In the atmospheric pressure plasma process to form the insulating film 5, electric discharge is performed under substantially atmospheric pressure, and plasma excitation of an active gas occurs, which results in formation of a thin film on a substrate. This process is described in Japanese Patent Laid-Open Publications No. 11-61406, No. 11-133205, No. 2000-121804, No. 2000-147209 and No. 2000-185362. By this process, a high-performance thin film can be formed at a high productivity.

The insulating film 5 may be a film of an organic compound. The organic compound may be polyimide, polyamide, polyester, polyacrilate, photo-radical polymerization photo-setting resin, photo-cationic polymerization photosetting resin, copolymer containing acrylonitrile, polyvinyl phenol, polyvinyl alcohol, novolak resin, cyano ethyl pullulan, etc.

As a process of forming an insulating film 5 of an organic compound, a wet process is preferred. An inorganic oxide insulating film and an organic oxide insulating film can be stacked upon each other to be used together. These insulating films are generally of a thickness within a range from 50 nm to 3 μm, and preferably within a range from 100 nm to 1 μm.

Further, the insulating film 5 may be formed in a solution. For example, when the gate electrode 3 is aluminum, the insulating film 5 can be formed by anodic oxidation in a solution of ammonium of boric acid. The process of forming the insulating film 5 shall be selected from the processes above according to the structure of the OTFT to be produced and the insulating material used.

Figure 1D:
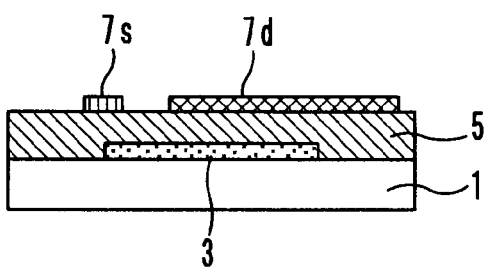

Next, on the gate insulating film 5, a source electrode 7s and a drain electrode 7d are formed (see FIG. 1d). The process of forming the source electrode 7s and the drain electrode 7d and the material of these electrodes 7s and 7d are the same as those of the gate electrode 3. First, on the gate insulating film 5, a conductive thin film (not shown), which is to turn into the source electrode 7s and the drain electrode 7d, is formed. The material of this conductive thin film is not particularly limited as long as it is conductive, and a metal material which guarantees sufficient conductivity is preferred. For example, Al, Cr, Ag, Mo and materials containing these metals and a doping agent, etc. can be used for the conductive thin film. The conductive thin film may be formed by conventional evaporation, sputtering or the like. Further, by conventional photolithography (resist coating, exposure and development) and etching, the source electrode 7s and the drain electrode 7s are formed (see FIG. 1d).

Figures 1, 2A:
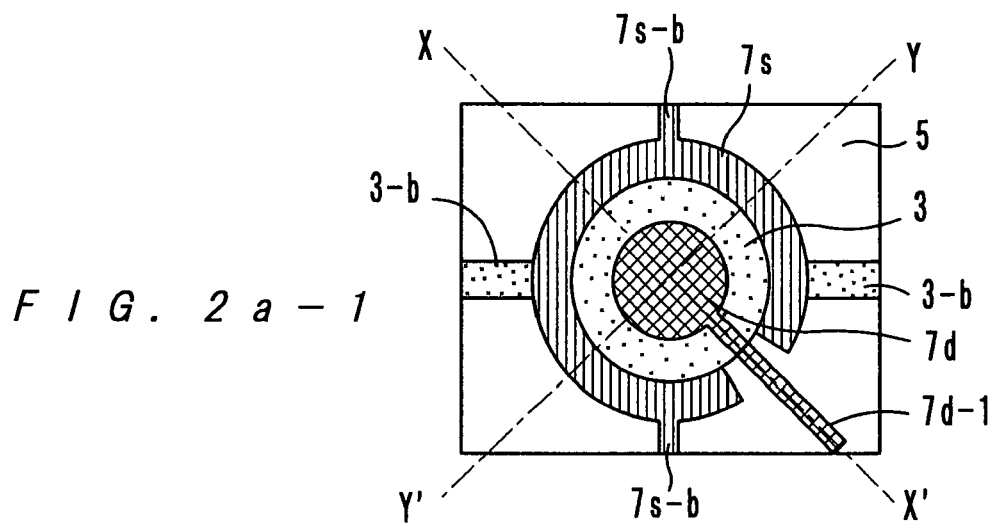
FIGS. 2a-1 and 2a are illustrations showing shapes of a source electrode and a drain electrode of the OTFT shown by FIG. 1 and showing dropping of an organic semiconductor solution.
Figure 2A:
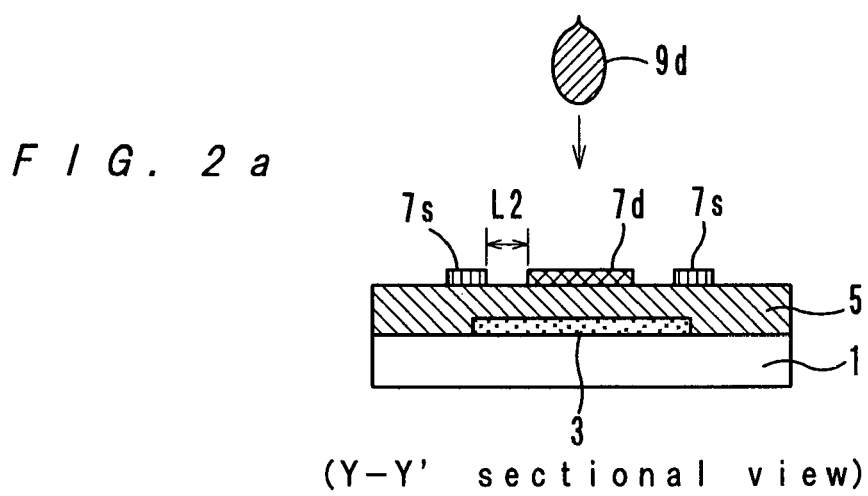

FIG. 2a-1 shows the source electrode 7s and the drain electrode 7d formed at this stage. FIG. 1d is a sectional view taken along the line X-X' in FIG. 2a-1, and FIG. 2a is a sectional view taken along the line Y-Y' in FIG. 2a-1. Referring to FIG. 2a-1, an electrode portion 3-b extending horizontally from the gate electrode 3 is a gate bus, and an electrode portion 7s-b extending vertically from the source electrode 7s is a source bus. In a view from the electrode side, the gate electrode 3 may not be seen because of the existence of the gate insulating film 5. In FIG. 2a-1, however, the gate electrode 3 is shown for convenience, and in the following views, there are cases wherein the gate electrode is shown for convenience.

As FIG. 2a-1 shows, the source electrode 7s is of a fragmentary donut-like shape which is a disk with a center hole and a cut-off portion. The drain electrode 7d is in the shape of a disk and is located in the center hole of the source electrode 7s such that the disk-like drain electrode 7d and the donut-like source electrode 7s are substantially concentric with each other. By this concentric arrangement of the source electrode 7s and the drain electrode 7d, the distance between the inner circumference of the source electrode 7s and the outer circumference of the drain electrode 7d is almost constant in every direction. Thereby, a channel in an organic semiconductor layer 9, which is to be formed at a later process to cover the source electrode 7s and the drain electrode 7d, will have a substantially constant width from the drain electrode d in a radial direction, which is desired so as to produce an OTFT with a stable performance.

Figure 1E:
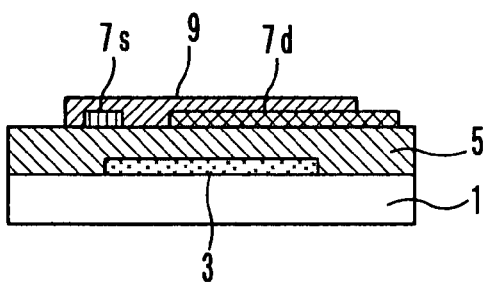

Next, an organic semiconductor layer 9 is formed on the source electrode 7s and the drain electrode 7d (see FIG. 1e). The material of the organic semiconductor layer 9 is not particularly limited as long as it can be dropped in an ink jet process or the like, and various kinds of condensed polycyclic aromatic compounds and conjugate compounds can be used.

The condensed polycyclic aromatic compounds are, for example, anthracene, tetracene, pentacene, hexacene, heptacene, phthalocyanine, porphyrine, etc. and derivatives of these compounds.

The conjugate compounds are, for example, polythiophene and its oligomers, polypyrrole and its oligomers, polyaniline, polyphenylene and its oligomers, polyphenylene vinylene and its oligomers, polythienylene vinylene and its oligomers, polyacetylene, polydiacetylene, tetrathiafulvalene compounds, quinon compounds, cyano compounds such as tetracyano kino dimethane, etc., flluerene, and derivatives and mixtures of these compounds.

Also, a doping treatment may be performed toward the material of the organic semiconductor layer 9. Specifically, an acceptor may be contained in the material of the organic semiconductor layer 9, and the acceptor may be, for example, a substance with a functional group, such as acrylic acid, acetamide, a dimethylamino group, a cyano group, a carboxyl group, a nitro group or the like, a benzoquinon derivative, tetracyano ethylene and tetracyano kino dimethane and derivatives thereof, etc. Otherwise, a donor may be contained in the material of the organic semiconductor layer 9, and the donor is, for example, a substance with a functional group, such as an amino group, a triphenyl group, an alkyl group, a hydroxyl group, an alkoxy group, a phenyl group or the like, a kind of substitutional amine such as phenylene diamine or the like, anthracene, benzoanthracene, a kind of substitutional benzoanthracene, pyrene, substitutional pyrene, carbazole and its derivative, tetrathiafulvalene and its derivative, etc.

Doping means introducing an acceptor or a donor as a dopant into the organic semiconductor thin film. Accordingly, a doped thin film is a thin film containing a condensed polycyclic aromatic compound and a dopant. Here, as listed above, any conventional dopant can be used.

The thickness of the organic semiconductor layer 9 is not particularly limited. However, the characteristics of the OTFT to be produced apt to depend on the thickness of the organic semiconductor layer. The thickness of the organic semiconductor layer is, while it must be designed in accordance with the material, generally not more than 1 μm and preferably is within a range from 10 nm to 300 nm.

In a process of dropping an, organic semiconductor material to form the organic semiconductor layer 9, an arbitrary solvent may be used as the solvent of a solution of the organic semiconductor material, and for example, a solvent is selected from a wide range of organic solvents, such as hydrocarbon, alcohol, ether, ester, ketone, glycol ether, etc., in accordance with the organic semiconductor material. Preferably, a solvent is selected from chain ether solvents such as diethyl ether, diisopropyl ether, etc., cyclic ether solvents such as tetrahydrofuran, dioxane, etc., ketone solvents such as acetone, methyl ethyl ketone, cyclohexanone, etc., aromatic solvents such as xylene, toluene, o-dichlorobenzene, nitrobenzene, m-cresol, etc., aliphatic hydrocarbon solvents such as hexane, cyclohexane, tridecane, etc., α-terpineol, alkyl halide solvents such as chloroform, 1,2-dichloroethane, etc., N-methyl pyrolidone and carbon disulfide. In view of application and film formation, the most desired solvent is an aliphatic organic solvent, for example, a solvent containing cyclohexane or hexane.

FIG. 2a schematically shows dropping of the solution of the organic semiconductor material on the source electrode 7s and the drain electrode 7d. It is preferred that the organic semiconductor solution 9d is dropped onto the center of the drain electrode 7d. The solution 9d spreads radially from the center and covers the drain electrode 7d. Further, the organic semiconductor solution 9d spreads out evenly and extends to the source electrode 9s which is located outside of the drain electrode 7d. Thus, using the organic semiconductor solution 9d in an excess volume is prevented.

Figure 3:
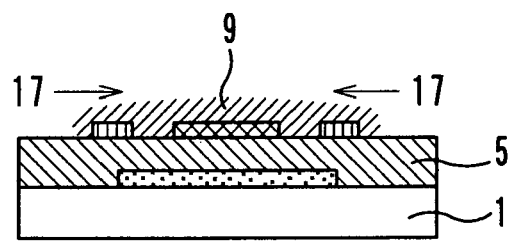
FIG. 3 is an illustration showing drying of the organic semiconductor solution on the source electrode and the drain electrode.
Figures 1, 10A:
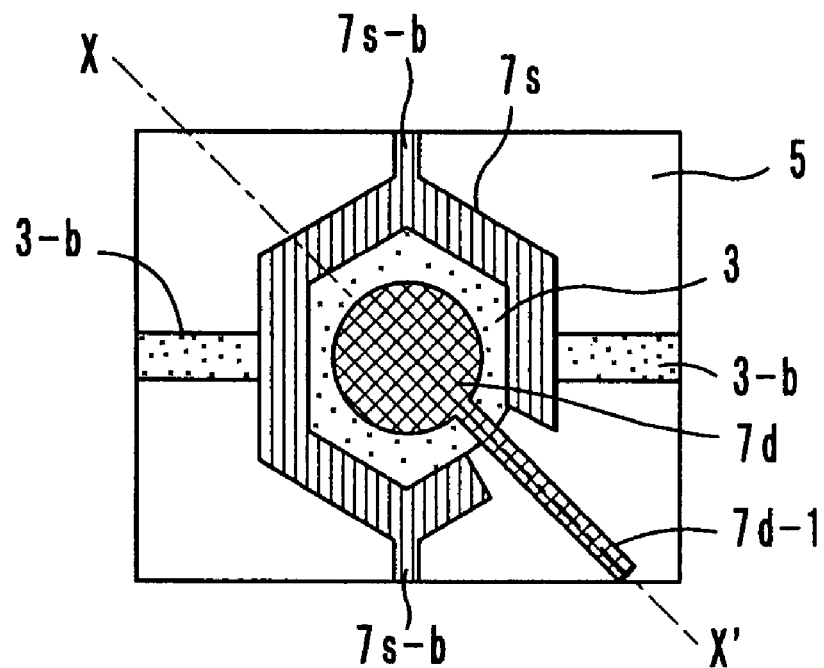
Figure 10A:
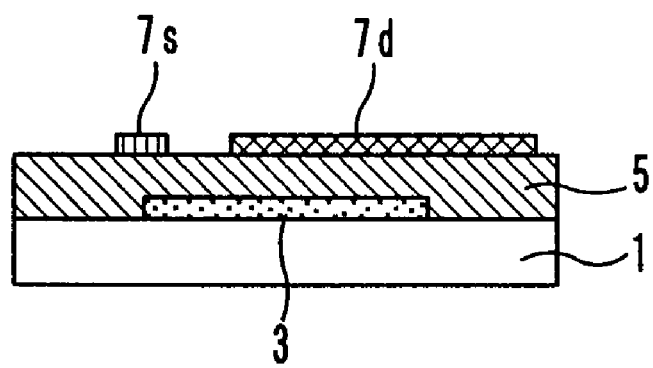
Figures 1, 11A:
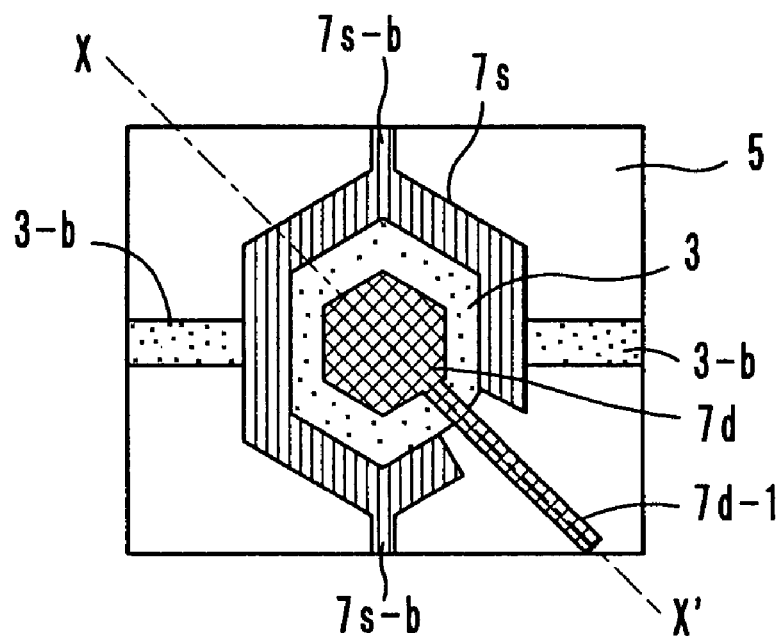
Figure 11A:
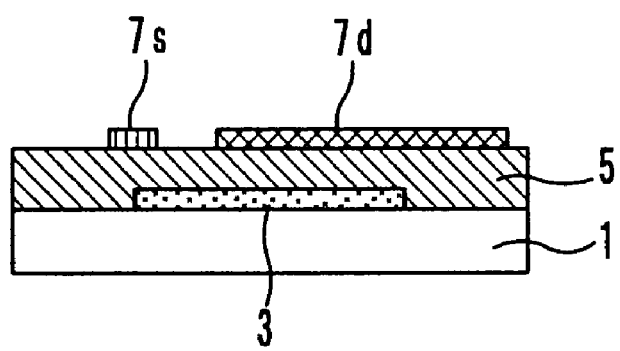

From an experiment conducted by the inventors, it has been found out that the semiconductor layer formed by dropping has alignment in a radial direction from the drop point, that is, the center of the drain electrode 7d. The organic semiconductor solution is dropped and spreads radically, and thereafter the solvent vapors. Thereby, the semiconductor layer 9 is formed. The vaporization of the solvent progresses from the thinnest portion which is the outer rim of the radially spread solution toward the central drop point, and therefore, the semiconductor layer 9 formed in this way has alignment from the outer rim to the center as indicated by arrows 17 in FIG. 3. This direction of alignment matches with the direction of a channel width. Therefore, also from the viewpoint of performance characteristic of the OTFT to be produced, it is preferred that the organic semiconductor solution is dropped onto the center of the drain electrode 7d.

If two or more drops of the organic semiconductor solution are applied to form the semiconductor layer 9, the drops overlap in spreading. Thereby, the thickness of the layer will be uneven, and the vapor of the solvent will not progress sequentially from the outer rim toward the center of the drain electrode 7d. In order to avoid this trouble, it is preferred that only one drop of the organic semiconductor solution is applied. Also, by reducing the number of drops applied, the time for application of the semiconductor solution can be shortened. Thus, also in order to heighten the productivity, it is preferred that only one drop of the semiconductor solution is applied.

Because this process is adopted to form the semiconductor layer 9, it is preferred that the source electrode 7s and the drain electrode 7d are circular (including fragmentally circular).

As a device for dropping the organic semiconductor solution, for example, an ink jet device with an ink jet head (a liquid drop discharge head) is used. The ink jet head of the ink jet device discharges a fixed quantity of a liquid composition continually. Also, a dispenser device may be used as such a liquid drop discharge device.

The liquid drop discharge device such as an ink jet device may be of a piezo-jet type which discharges a liquid composition by a change in the volume of a piezoelectric element or may be a type which discharges a liquid composition by sudden occurrence of steam due to application of heat.

The liquid composition means a medium with a viscosity in such a degree that permits discharge of the medium from nozzles of a discharge head of the liquid drop discharge device. The liquid composition may be water base or may be oil base. As long as the liquid composition has such a fluidity to be discharged from the nozzles, solid substances may be contained in the composition. The material contained in the composition may be dissolved by being heated up to a melting point of the material or may be dispersed as fine particles in a solvent.

Figure 1F:
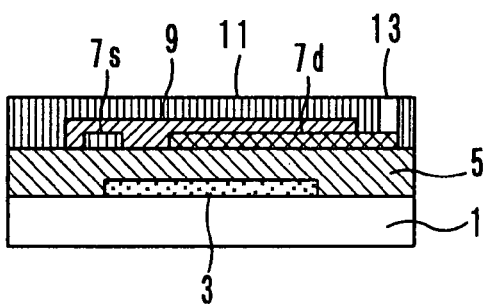
Figure 1G:
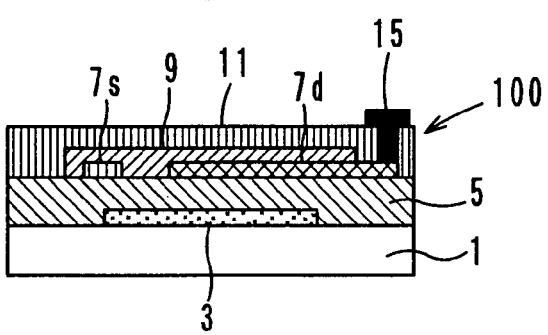

Next, on the organic semiconductor layer 9, a passivation film (protection layer) 11 is formed (see FIG. 1f). The passivation film 11 prevents the organic semiconductor layer 9 from degrading due to water, oxide, etc. in the air. For the passivation film 11, a material which will not influence the organic semiconductor layer 9 is used. When a layer of a photosensitive composition, for example, a photosensitive resin layer is to be formed on the passivation film 11 for patterning, the passivation film 11 is preferably made of a material which will not be influenced by the application of the photosensitive composition and the patterning of the photosensitive layer. Therefore, a material containing hydrophilic polymer is suited to be used as the material of the passivation film 11, and a solution of hydrophilic polymer or a liquid with hydrophilic polymer dispersed therein is more suited. Hydrophilic polymer is soluble or dispersible in water, an acidic solution, an alkaline solution, an alcoholic solution and solutions of various interfacial active agents. For example, polyvinyl alcohol, homopolymer and copolymer containing HEMA, acrylic acid, acryl amide, etc. can be used. Especially, polyvinyl alcohol is suited.

There are no particular limitations to the process of forming the passivation film 11, and the passivation film 11 can be formed by a coating process such as spin coating or the like and can be formed by a patterning process on the organic semiconductor layer 9 by printing, an ink jet process or the like. The thickness of the passivation film 11 is within a range from 100 nm to 10 μm. Also, the passivation film 11 is desired to have a light transmittance of not more than 10%, and is more desired to have a light transmittance of not more than 1%. Thereby, the passivation film 11 further prevents the organic semiconductor layer 9 from degrading due to light.

Patterning of the passivation film 11 may be carried out by photolithography using photosensitive resin. The patterning may be carried out concurrently with the patterning of the source electrode 7s and the drain electrode 7d. In this case, after coating of the passivation film 11, a photosensitive resin layer is formed on passivation film 11 by applying a solution of photosensitive resin on the entire surface of the passivation film 11, and the photosensitive resin layer is patterned by conventional photolithography.

The photosensitive resin may be of a conventional positive type or may be of a conventional negative type. As a solvent for the solution of photosentive resin, propyrene glycol monomethyl ether, propyrene glycol monoethyl ether, ethylene glycol monomethyl ether, ethylene glycol monomethyl ether acetate, ethylene glycol monoethyl ether, ethylene glycol monoethyl ether acetate, dimethyl formamide, dimethyl sulfoxide, dioxane, acetone, cyclohexanone, trichloroethylene, methyl ethyl ketone, etc. can be used. These materials may be used by themselves or by combination.

The photosensitive resin layer is formed by a coating process, such as spray coating, spin coating, blade coating, dip coating, casting, roll coating, bar coating, die coating, etc.

In this way, a photosensitive resin layer (not shown) may be formed on the passivation film 11, and the photosensitive resin layer may be patterned. Then, a contact electrode 15 or a pixel electrode (not shown) may be formed in a portion 13 from which a resist has been removed.

If the contact electrode 15 or the pixel electrode is formed by vacuum evaporation or sputtering, the organic semiconductor layer 9 may be damaged by the vacuum evaporation, the sputtering and further patterning by use of a resist accompanying the vacuum evaporation and the sputtering. Therefore, it is preferred that a fluid electrode material is formed into the contact electrode 15 or the pixel electrode by a printing process, such as relief printing, intaglio printing, planographic printing, screen printing, or an ink jet process.

The fluid electrode material is a liquid with conductive fine particles dispersed therein, a solution of conductive polymer, a liquid with conductive polymer dispersed therein or the like.

The liquid with conductive fine particles dispersed therein is, for example, a paste or an ink which is prepared by dispersing conductive fine particles of metal or the like in water, an organic solvent or a liquid mixture containing an organic solvent by use of a dispersion stabilizing agent. Since this is coated on the organic semiconductor layer, the above-described water-based liquid with conductive fine particles dispersed therein, is preferably used.

The metal (metal fine particles) for the conductive fine particles may be platinum, gold, silver, cobalt, nickel, chrome, copper, ion, tin, antimony, lead, tantalum, indium, palladium, tellurium, rhenium, iridium, aluminum, ruthenium, germanium, molybdenum, tungsten, zinc or the like. Especially, platinum, gold, silver, copper, cobalt, chrome, iridium, nickel, palladium, molybdenum and tungsten, of which work functions are not less than 4.5 eV, are preferred.

Also, the conductive polymer used as the electrode material is conventional conductive polymer of which conductivity is heightened by doping or the like, and for example, conductive polyaniline, conductive polypyrrole, conductive polythiophene, a complex of polyethylene dioxithiophene and polystyrene sulfonate (PEDOT/PSS), etc. are suited. Especially a material which has a low resistance on a surface which is to be in contact with the semiconductor layer is preferred.

The above-described fluid conductive material can be used not only for the contact electrode 15 or the pixel electrode but also for the gate electrode 3, the source electrode 7s and the drain electrode 7d.

Also, a water repellent layer (see number 19 in FIG. 5a) may be used. For example, if a water repellent layer is formed on the drain electrode 7d before forming the semiconductor layer 9, the semiconductor layer 9 will not exist on the drain electrode 7d. Also, if a water repellent layer is formed on a part of the semiconductor layer 9 before forming the passivation film 11, the passivation film 11 will not exist on the part of the semiconductor layer 9. Thereby, it becomes easy to form the contact electrode 15 to be in contact with the drain electrode 7d.

The water repellent layer is preferably made of silicon rubber or the like, and phenol resin, epoxy resin and lipophilic materials such as silan coupling agents are also usable. Further, self-assembled monolayers, which can be also used for alignment and which can be removed easily by exposure to ultraviolet rays, such as octadecyl trichlorosilan, trichloromethyldisilazane, alkane phosphate, alkane sulfonate, alkane carbonate, etc., may be used.

Production of an OTFT of a bottom gate bottom contact type has been described above. OTFTs of the other types, namely, a bottom gate top contact type, top gate bottom contact type and top gate top contact type can be produced in similar ways by selecting the materials, the method and the order of processes appropriately.

Also, it is important that the source electrode 7s and the drain electrode 7d are substantially concentric with each other. The source electrode 7s and the drain electrode 7d described above are concentric circles. However, the outer circumference of the inner-located electrode may be circular or polygonal, as long as the inner circumference of the other (outer-located) electrode which faces the outer circumference of the inner-located electrode is concentric with the circle or the polygon of the inner-located electrode. In other words, there may be a case wherein the outer circumference of the drain electrode 7d is circular and the inner circumference of the source electrode 7s is polygonal substantially concentric with the circle of the drain electrode 7d. Also, there may be a case wherein the outer circumference of the drain electrode 7d is polygonal and the inner circumference of the source electrode 7s is polygonal substantially in concentric with the polygon of the drain electrode 7d.

FIGS. 10a-1 and 10a-10c show a case wherein the outer circumference of the drain electrode 7d is circular and the inner circumference of the source electrode 7s is hexagonal in concentric with the circle of the drain electrode 7d. FIGS. 11a-1 and 11a-11c shows a case wherein the outer circumference of the drain electrode 7d and the inner circumference of the source electrode 7s are concentric hexagons which are arranged such that the corners of one hexagon are at the same angles as the corners of the other hexagon.

In the present invention, the meaning of the word "circular" includes elliptic even with distortion. When either or both of the electrodes is/are made polygonal, the more corners the polygon has, the better. In order to avoid concentration of electric fields, it is preferred that the source electrode 7s and the drain electrode 7d are arranged such that the distance between these electrodes is uniform in every direction. If the distance between these electrodes is not uniform, the current flowing in the organic semiconductor layer 9 varies from part to part, and the part where a large current flows degrades earlier. If the electrodes are polygons with a small number of corners, the distance between the electrodes varies, and the organic semiconductor layer 9 is likely to degrade early.

The inventors tried to produce OFTFs by using materials and processes described above. In the following, the production processes and the OFTFs produced are described.

Example 1

As a first example, an OFTF 100 of a bottom gate bottom contact type as shown by FIG. 1 was produced. The production processes are described referring to FIGS. 1a-1g.

On a glass substrate 1 shown by FIG. 1a, a kind of aluminum alloy, namely, aluminum-neodymium (AlNd), was formed into a film with a thickness of 150 nm by sputtering. Then, photolithography and etching were performed toward the AlNd film, and thereby, a circular gate electrode 3 was formed (see FIG. 1b).

Next, as a gate insulating film 5, $SiO_2$ was formed into a film with a thickness of 300 nm by a plasma CVD process (see FIG. 1c).

Next, a resist pattern was formed by photolithography and etching so that a source electrode 7s which is a fragmental circle with a center hole and a drain electrode 7d which is in concentric with the source electrode 7s and which has a leading line 7d-1 could be formed by a lift-off method.

Next, a chromium film with a thickness of 5 nm was formed, and further a gold film with a thickness of 50 nm was formed on the chromium film. These films were to turn into the source electrode 7s and the drain electrode 7d, and these films were formed by sputtering. Thereafter, the resist pattern was lifted off by a resist remover, and thereby, the source electrode 7s and the drain electrode 7d were formed (FIG. 1d). FIG. 1d is a sectional view taken along the line X-X' in FIG. 2a-1. Also, FIG. 2a is a sectional view taken along the line Y-Y' in FIG. 2a-1.

Next, a solution of 6,13-bistri isopropyl siril ethynyl pentacene (which will be hereinafter referred to as pentacene) was prepared as an organic semiconductor solution, and one drop of the organic semiconductor solution 9d was applied on substantially the center of the drain electrode 7d as shown by FIG. 2a by an ink jet process. Thereby, an organic semiconductor layer 9 to cover the drain electrode 7d and the source electrode 7s was formed (FIG. 1e). At this stage, the pentacene solution dropped was of such a volume that the formed semiconductor layer 9 after vaporization of the solvent would be approximately 50 nm. The volume was calculated in advance based on an experiment.

Next, by spin coating PVA124C (trade name, non-photosensitve polyvinyl alcohol resin made by Kuraray Co., Ltd.), a passivation film 11 with a thickness of approximately 2 μm was formed, and by applying PC403 (trade name, made by JSR Corporation) onto the passivation film 11, a photosensitive insulating film with a thickness of 1 μm was formed. Thereafter, photolithography (exposure and development) was performed by using the PC403 film as a resist, and thereby, a contact hole 13 for an electrode for connecting the drain electrode 7d to a pixel electrode (which will be described later) was formed. More specifically, the photosensitive insulating film of PVC403 was removed by mask exposure and development from the part where the contact hole was to be formed, and thereafter, the passivation film of PVA124C revealed in the part was washed away by water. Thus, a part of the drain electrode 7d was revealed.

Next, an ITO (indium tin oxide) layer with a thickness of 150 nm was formed on the passivation film 11 by sputtering, and a contact electrode 15 and a pixel electrode (not shown) were formed by photolithography and etching. In this way, an OTFT 100 was completed.

The OTFT 100 of the first example was operated, and it was confirmed that the OTFT 100 had a good switching performance.

Control Example 1

As a control example 1, an OTFT 100R shown by FIGS. 12a-1 and 12a-12c which is of a bottom gate bottom contact type and of the same structure as the above-described example 1 was produced basically by using the same materials and the same processes as those of the example 1. The difference from the example 1 was that the source electrode 7s and the drain electrode 7d were not circular and were of an interdigital type.

Here, a channel length and a channel width are defined as follows. The channel length in the example 1 is a difference between a radius of the outer circumference of the drain electrode 7d and a radius of the inner circumference of the source electrode 7s ("L2" shown in FIG. 2a). The channel length in the control example 1 is a distance between a finger of the source electrode 7s and an adjacent finger of the drain electrode 7d ("L10" shown in FIG. 12a).

The channel width W2 in the example 1 is a length of the outer circumference of the drain electrode 7d (excluding the part facing the cut-off portion of the source electrode 7s). The channel width W10 in the control example 1 is the sum of lengths of parts where the source electrode 7s and the drain electrode 7d face each other. Then, in producing the control example 1, the shapes and the dimensions of the source electrode 7s and the drain electrode 7d were determined such that W2/L2 of the example 1 would be substantially equal to W10/L10 of the control example 1.

Results of Control Experiment

Twenty OTFTs 100 of the example 1 and twenty OTFTs 100R of the control example 1 were produced, and these OTFTs 100 and 100R were compared in performance. Then, the following results were obtained: (1) the on current (Ion) of the control example 1 was approximately half of that of the example 1; (2) the off current (Ioff) of the control example 1 was approximately twice of that of the example 1; and (3) regarding the ratio of the on current to the off current (Ion/Ioff) of each OTFT, the range of variations among the OTFTs of the example 1 was smaller than the range of variations among the OTFTs of the control example 1.

The on current and the off current of each OFTF were measured in the following way. While a gate voltage was heightened gradually, the current flowing between the source and the drain was measured, and a saturated current value was designated as the on current. A current flowing between the source and drain with no gate voltage applied was designated as the off current.

It is inferred that the results (1)-(3) above were caused by the difference in characteristic between the organic semiconductor layer of the example 1 and that of the control example 1. In the OTFT of the example 1, drying of the organic semiconductor solution following vaporization of the solvent progressed in the radial direction of the concentric circles of the source electrodes 7s and the drain electrodes 7d, and particles of the semiconductor material were aligned in the radial direction. Thus, in the OTFT 100 of the first example 1, there was a specified relation between the alignment of the organic semiconductor layer and the channel direction. In the OFTF 100R of the control example 1, however, the source electrode 7s and the drain electrode 7d are of an interdigital type, and there was no relation between the alignment of the organic semiconductor layer and the channel direction. It is inferred that the difference is the reason why the performance of the OTFTs 100R of the control example was poor.

An organic semiconductor layer formed by dropping has a thickness which is uniform in a circle with its center located at the drop point but which varies in a radial direction from the drop point. Therefore, it is inferred that in the OTFT 100R shown by FIGS. 12a-1 and 12a-12c with the source electrode and the drain electrode of an interdigital type, a thick part of the organic semiconductor layer was within the channel, because of which, the off current of the OTFT 100R was large.

In producing the OTFT 100R of the control example, if the organic semiconductor solution was dropped on a position off a designed point, the dislocating direction and the dislocating distance would influence the performance of the produced OTFT 100R. In producing the OTFT 100, if the organic semiconductor solution was dropped on a position off a designed point (off the center of the drain electrode 7d), only the dislocating distance (the distance from the center of the drain electrode 7d) would influence the performance of the produced OTFT 100. Therefore, the influence of the dislocation of the drop point onto the ratio of the on current to the off current would be smaller in the OTFT 100 of the example 1 than in the OTFT 100R of the control example 1. It is inferred that for this reason, the range of variations among the OTFTs of the example 1 in the ratio of the on current to the off current was smaller than the range of variations among the OTFTs of the control example 1.

Example 2

As a second example, an OTFT 400 of a bottom gate bottom contact type was produced. The OTFT 400 was produced through the same processes as the OTFT 100 of the example 1. The differences from the OTFT 100 were that the OTFT 400 shown by FIG. 4a-1, had a circular source electrode 7s with a center hole and a circular drain electrode 7d and that the OTFT 400 had a contact hole 13 above the drain electrode 7d to connect the drain electrode 7d to a pixel electrode.

FIG. 4a shows a state wherein after forming a gate electrode 3 on a glass substrate 1, a gate insulating film 5 was formed, and further the source electrode 7s and the drain electrode 7d were formed on the gate insulating film 5. FIG. 4a is a sectional view taken along the line X-X' in FIG. 4a-1.

FIG. 4b shows a state wherein after forming the source electrode 7s and the drain electrode 7d, an organic semiconductor layer 9 was formed.

FIG. 4c shows a state wherein after forming the organic semiconductor layer 9, a passivation film 11, a photosensitive insulating film (not shown), and a contact electrode 15 and a pixel electrode (not shown) were formed.

The OTFT 400 of the example 2 was operated, and it was confirmed that the performance of the OTFT 400 was as good as that of the OTFT 100 of the example 1.

Example 3

As a third example, an OTFT 500 of a bottom gate bottom contact type was produced. As FIGS. 5a-1 and 5a-5c show, in order to form a contact hole 13 in the OTFT 500, a water repellent layer was formed on a drain electrode.

On a glass substrate 1, a kind of an aluminum alloy, namely, aluminum-neodymium (AlNd) was formed into a film with a thickness of 150 nm by sputtering. Then, photolithography and etching were performed toward the AlNd film, and thereby, a circular gate electrode 3 was formed.

Next, as a gate insulating film 5, $SiO_2$ was formed into a film with a thickness of 300 nm by a plasma CVD process.

Next, as shown by FIG. 5a-1, a resist pattern was formed by photolithography and etching so that a circular source electrode 7s with a center hole and a drain electrode 7d which is in concentric with the source electrode 7s could be formed by a lift-off method.

Next, a chromium film with a thickness of 5 nm was formed, and further a gold film with a thickness of 50 nm was formed on the chromium film. These films were to turn into the source electrode 7s and the drain electrode 7d, and these films were formed by sputtering. Thereafter, the resist pattern was lifted off by a resist remover, and thereby, the source electrode 7s and the drain electrode 7d were formed (FIG. 5a). FIG. 5a is a sectional view taken along the line X-X' in FIG. 5a-1.

Next, octadecyl trichlorosilan was applied onto the drain electrode 7d by an ink jet process, and thus, a water repellent layer 19 was formed.

Next, a drop of a pentacene solution was applied on substantially the center of the drain electrode 7d by an ink jet process. At that moment, the existence of the water repellent layer 19 on the drain electrode 7d prevented formation of a semiconductor layer on the drain electrode 7d, and the organic semiconductor layer 9 was formed to enclose the drain electrode 7d and to cover the source electrode 7s. At this stage, the pentacene solution dropped was of such a volume that the formed semiconductor layer 9 after vaporization of the solvent would be approximately 50 nm. The volume was calculated in advance based on an experiment.

Next, by spin coating PVA124C (trade name, non-photosensitve polyvinyl alcohol resin made by Kuraray Co., Ltd.), a passivation film 11 with a thickness of approximately 3 μm was formed. At that moment, the water repellent layer 19 on the drain electrode 7d prevented formation of the passivation layer 11 on the drain electrode 7d.

Next, the water repellent layer 19 was exposed to ultraviolet rays and thereby was removed away.

Next, an ITO (indium tin oxide) layer with a thickness of 150 nm was formed by sputtering, and a contact electrode 15 and a pixel electrode (not shown) were formed by photolithography and etching. In this way, an OTFT 500 was completed.

The OTFT 500 of the example 3 was operated, and it was confirmed that the OTFT 500 had a good switching performance.

In the example 3, in order to show a preferred example, the water repellent layer 19 on the drain electrode 7d was removed. However, the OTFT 500 would have operated satisfactorily even if the water repellent layer 19 had not been removed.

Example 4

As a fourth example, an OTFT 600 of a bottom gate bottom contact type was produced. As FIGS. 6a-1 and 6a-6c show, the OTFT 600 has a drain electrode 7d and its leading line 7d-1 in the same layer.

On a glass substrate 1, a kind of an aluminum alloy, namely, aluminum-neodymium (AlNd) was formed into a film with a thickness of 150 nm by sputtering. Then, photolithography and etching were performed toward the AlNd film, and thereby, a circular gate electrode 3 was formed.

Next, by applying PC403 (trade name, made by JSR Corporation), a photosensitive insulating film with a thickness of 150 nm was formed as a photosensitive insulating film 5a.

Subsequently, a chromium film with a thickness of 5 nm was formed to be used as a leading line 7d-1 of a drain electrode which will be formed later, and a gold film with a thickness of 50 nm was formed thereon by sputtering.

Next, PC403 was applied by spin coating to form a photosensitive insulating film 5b, and the photosensitive insulating film 5b was patterned by photolithography so that a drain electrode 7d could be formed.

Next, a resist pattern was formed by photolithography and etching so that a source electrode 7s which is a circle with a center hole and a drain electrode 7d which is in concentric with the source electrode 7s could be formed by a lift-off method.

Next, a chromium film with a thickness of 5 nm was formed, and further a gold film with a thickness of 50 nm was formed on the chromium film. These films were to turn into the source electrode 7s and the drain electrode 7d, and these films were formed by sputtering. Thereafter, the resist pattern was lifted off by a resist remover, and thereby, the source electrode 7s and the drain electrode 7d were formed (see FIG. 6a). FIG. 6a is a sectional view taken along the line X-X' in FIG. 6a-1.

Next, one drop of a pentacene solution was applied on substantially the center of the drain electrode 7d by an ink jet process. At this stage, the pentacene solution dropped was of such a volume that the formed semiconductor layer 9 after vaporization of the solvent would be approximately 50 nm. The volume was calculated in advance based on an experiment.

Next, by applying PVA124C (trade name, non-photosensitve polyvinyl alcohol resin made by Kuraray Co., Ltd.) by spin coating, a passivation film 11 with a thickness of approximately 2 μm was formed, and by applying PC403 (trade name, made by JSR Corporation) onto the passivation film 11, a photosensitive insulating film with a thickness of 1 μm was formed. Thereafter, photolithography (exposure and development) was performed by using the PC403 film as a resist, and thereby, a contact hole 13 for an electrode for connecting the leading line 7d-1 of the drain electrode 7d to a pixel electrode (which will be described later) was formed. More specifically, from the part where the contact hole is to be formed, the photosensitive insulating film of PVC403 was removed by mask exposure and development, and thereafter, the passivation film of PVA124C revealed in the part was washed away by water. Thus, a part of the leading line 7d-1 was revealed.

Next, an ITO (indium tin oxide) layer with a thickness of 150 nm was formed on the passivation film 11 by sputtering, and a contact electrode 15 and a pixel electrode (not shown) were formed by photolithography and etching. In this way, an OTFT 600 was completed.

The OTFT 600 of the fourth example was operated, and it was confirmed that the OTFT 600 had a good switching performance.

Example 5

As a fifth example, an OTFT 700 of a bottom gate top contact type as shown by FIGS. 7b-1 and 7a-7c was produced.

On a glass substrate 1, a kind of an aluminum alloy, namely, aluminum-neodymium (AlNd) was formed into a film with a thickness of 150 nm by sputtering. Then, photolithography and etching were performed toward the AlNd film, and thereby, a circular gate electrode 3 was formed.

Next, as a gate insulating layer 5, a film of $SiO_2$ with a thickness of 300 nm was formed by a plasma CVD process.

Next, one drop of a pentacene solution was applied in a position which would be a center of a drain electrode 7d to be formed later, and thereby, an organic semiconductor layer 9, which would be an underlay for underlying entirely a drain electrode 7d and a source electrode 7s to be formed later, was formed. At this stage, the pentacene solution dropped was of such a volume that the formed semiconductor layer 9 after vaporization of the solvent would be approximately 50 nm. The volume was calculated in advance based on an experiment.

Next, as FIG. 7b-1 shows, the source electrode 7s which is a fragmentary circle with a center hole and the drain electrode 7d which is a concentric circle with the source electrode 7s and which has a leading line 7d-1 were formed by vacuum evaporation using a mask. Specifically, first, a chromium film with a thickness of 5 nm was formed, and a gold film with a thickness of 50 nm was formed on the chromium film.

Next, by applying PVA124C (trade name, non-photosensitve polyvinyl alcohol resin made by Kuraray Co., Ltd.) by spin coating, a passivation film 11 with a thickness of approximately 2 μm was formed, and by applying PC403 (trade name, made by JSR Corporation) onto the passivation film 11, a photosensitive insulating film with a thickness of 1 μm was formed. Thereafter, photolithography (exposure and development) was performed by using the PC403 film as a resist, and thereby, a contact hole 13 for an electrode for connecting the leading line 7d-1 of the drain electrode 7d to a pixel electrode (which will be described later) was formed. More specifically, the photosensitive insulating film of PVC403 was removed by mask exposure and development from the part where the contact hole was to be formed, and thereafter, the passivation film of PVA124C revealed in the part was washed away by water. Thus, a part of the leading line 7d-1 of the drain electrode 7d was revealed.

Next, an ITO (indium tin oxide) layer with a thickness of 150 nm was formed on the passivation film 11 by sputtering, and a contact electrode 15 and a pixel electrode (not shown) were formed by photolithography and etching. In this way, an OTFT 700 was completed.

The OTFT 700 of the fifth example was operated, and it was confirmed that the OTFT 700 had a good switching performance.

Example 6

As a sixth example, an OTFT 800 of a top gate bottom contact type as shown by FIGS. 8a-1 and 8a-8c was produced.

On a glass substrate 1, a kind of an aluminum alloy, namely, aluminum-neodymium (AlNd) was formed into a film with a thickness of 150 nm by sputtering. Then, photolithography and etching were performed toward the AlNd film, and thereby, as shown by FIG. 8a-1, a source electrode 7s which is a fragmentary circle with a center hole and a drain electrode 7d which is a concentric circle with the source electrode 7s and which has a leading line 7d-1 were formed.

Next, one drop of a pentacene solution was applied onto substantially the center of the drain electrode 7d, and an organic semiconductor layer 9 to cover the drain electrode 7d and the source electrode 7s was formed. At this stage, the pentacene solution dropped was of such a volume that the formed semiconductor layer 9 after vaporization of the solvent would be approximately 50 nm. The volume was calculated in advance based on an experiment.

Next, by applying PC403 (trade name, made by JSR Corporation) by spin coating, a gate insulating film 5 was formed, and the insulating film 5 was patterned by photolithography so that the insulating film 5 would have a contact hole for an electrode for connecting the drain electrode 7d to a pixel electrode.

Next, a gate electrode 3 was formed by vacuum evaporation by using a mask. Specifically, first a chromium film with a thickness of 5 nm was formed, and a gold film with a thickness of 50 nm was formed on the chromium film (see FIG. 8b).

Next, by applying PVA124C (trade name, non-photosensitve polyvinyl alcohol resin made by Kuraray Co., Ltd.) by spin coating, a passivation film 11 with a thickness of approximately 2 μm was formed, and by applying PC403 (trade name, made by JSR Corporation) onto the passivation film 11, a photosensitive insulating film with a thickness of 1 μm was formed. Thereafter, photolithography (exposure and development) was performed by using the PC403 film as a resist, and thereby, a contact hole 13 for an electrode for connecting the leading line 7d-1 of the drain electrode 7d to a pixel electrode (which will be described later) was formed. More specifically, the photosensitive insulating film of PVC403 was removed by mask exposure and development from the part where the contact hole was to be formed, and thereafter, the passivation film of PVA124C revealed in the part was washed away by water. Thus, a part of the leading line 7d-1 was revealed.

Next, an ITO (indium tin oxide) layer with a thickness of 150 nm was formed on the passivation film 11 by sputtering, and a contact electrode 15 and a pixel electrode (not shown) were formed by photolithography and etching. In this way, an OTFT 800 was completed.

The OTFT 800 of the fifth example was operated, and it was confirmed that the OTFT 800 had a good switching performance.

Example 7

As a seventh example, an OTFT 900 of a top gate top contact type as shown by FIGS. 9b-1 and 9a-9c was produced.

On a glass substrate 1, one drop of a pentacene solution was applied in a position which would be a center of a drain electrode 7d to be formed later, and thereby, an organic semiconductor layer 9, which would be an underlay for underlying entirely a drain electrode 7d and a source electrode 7s to be formed later, was formed. At this stage, the pentacene solution dropped was of such a volume that the formed semiconductor layer 9 after vaporization of the solvent would be approximately 50 nm. The volume was calculated in advance based on an experiment.

Next, a kind of an aluminum alloy, namely, aluminum-neodymium (AlNd) was formed into a film with a thickness of 150 nm by sputtering. Then, photolithography and etching were performed toward the AlNd film, and thereby, as FIG. 9b-1 shows, the source electrode 7s which is a fragmentary circle with a center hole and the drain electrode 7d which is a concentric circle with the source electrode 7s and which has a leading line 7d-1 were formed by vacuum evaporation using a mask.

Next, by applying PC403 (trade name, made by JSR Corporation) by spin coating, a photosensitive insulating film was formed as a gate insulating film 5, and the insulating film was patterned by photolithography such that the insulating film would have a contact hole for an electrode for connecting the drain electrode 7d to a pixel electrode.

Next, a gate electrode 3 was formed by vacuum evaporation by using a mask. Specifically, a chromium film with a thickness of 5 nm was formed, and a gold film with a thickness of 50 nm was formed on the chromium film.

Next, by applying PVA124C (trade name, non-photosensitve polyvinyl alcohol resin made by Kuraray Co., Ltd.) by spin coating, a passivation film 11 with a thickness of approximately 2 μm was formed, and by applying PC403 (trade name, made by JSR Corporation) onto the passivation film 11, a photosensitive insulating film with a thickness of 1 μm was formed. Thereafter, photolithography (exposure and development) was performed by using the PC403 film as a resist, and thereby, a contact hole 13 for an electrode for connecting the leading line 7d-1 of the drain electrode 7d to a pixel electrode (which will be described later) was formed. More specifically, the photosensitive insulating film of PVC403 was removed by mask exposure and development from the part where the contact hole was to be formed, and thereafter, the passivation film of PVA124C revealed in the part was washed away by water. Thus, a part of the leading line 7d-1 of the drain electrode 7d was revealed.

Next, an ITO (indium tin oxide) layer with a thickness of 150 nm was formed on the passivation film 11 by sputtering, and a contact electrode 15 and a pixel electrode (not shown) were formed by photolithography and etching. In this way, an OTFT 900 was completed.

The OTFT 900 of the seventh example was operated, and it was confirmed that the OTFT 900 had a good switching performance.

Although the present invention has been described in connection with the preferred embodiments above, it is to be noted that various changes and modifications are possible to those who are skilled in the art. Such changes and modifications are to be understood as being within the scope of the present invention.

What is claimed is:

1. A method for producing an organic thin film transistor comprising, on a substrate, a source electrode, a gate electrode, a drain electrode, an insulating layer and an organic semiconductor layer, said method comprising:
    forming the source electrode and the drain electrode such that one of the source and drain electrodes, which is an inner-located electrode, has an outer circumference which is in the shape of a circle or is in the shape of a polygon and that the other of the source and drain electrodes, which is an outer-located electrode, has an inner circumference facing the outer circumference of the inner-located electrode, the inner circumference being of a shape which is substantially concentric with the outer circumference of the inner-located electrode;
    forming the organic semiconductor layer, after forming the source electrode and the drain electrode, so as to connect the source electrode and the drain electrode to each other by a process of dropping an organic semiconductor material;
    forming a water repellent layer on the source electrode and the drain electrode formed by the electrode forming step;
    forming a protection layer on the substrate with the organic semiconductor layer;
    removing the water repellent layer; and
    forming a contact hole which pierces through the protection layer.

2. A method according to claim 1, wherein the dropping process in the organic semiconductor layer forming process is an ink jet process.

3. A method according to claim 1, wherein one drop is applied in the dropping process.

4. A method according to claim 1, wherein the inner circumference of the outer-located electrode is of a same shape as that of the outer circumference of the inner-located electrode.

5. The method of claim 1, wherein the inner-located electrode is positioned nearer to a surface of the substrate than the outer-located electrode as measured along a direction perpendicular to the surface.

6. The method of claim 5, wherein the outer-located electrode overlaps the inner-located electrode and the surface.

7. The method of claim 6, wherein the inner-located electrode overlaps the surface.

8. The method of claim 1, wherein the process of dropping results in the organic semiconductor layer having an even thickness.

9. The method of claim 8, wherein the process of dropping comprises having a drop of the organic semiconductor material land onto a center of the inner-located electrode and then spread radially to reach the outer-located electrode.

10. The method of claim 9, wherein the process of dropping results in the organic semiconductor layer being aligned from an outer rim of the outer-located electrode to the center of the inner-located electrode and along a direction of alignment that matches a direction of a channel width of the organic thin film transistor.

11. The method of claim 8, wherein the process of dropping results in the organic semiconductor layer being aligned along a direction of alignment that matches a direction of a channel width of the organic thin film transistor.

12. The method of claim 1, wherein the process of dropping results in the organic semiconductor layer being aligned along a direction of alignment that matches a direction of a channel width of the organic thin film transistor.

13. The method of claim 1, wherein the process of dropping results in the organic semiconductor layer being aligned from an outer rim of the outer-located electrode to the center of the inner-located electrode and along a direction of alignment that matches a direction of a channel width of the organic thin film transistor.

14. A method for producing an organic thin film transistor comprising, on a substrate, a source electrode, a gate electrode, a drain electrode, an insulating layer and an organic semiconductor layer, said method comprising:
    forming the gate electrode on the substrate;
    forming the insulating layer so as to cover the gate electrode formed on the substrate;
    forming the source electrode and the drain electrode on the insulating layer such that one of the source and drain electrodes, which is an inner-located electrode, has an outer circumference which is in the shape of a circle or in the shape of a polygon and that the other of the source and drain electrodes, which is an outer-located electrode, has an inner circumference facing the outer circumference of the inner-located electrode, the inner circumference being of a shape which is substantially concentric with the outer circumference of the inner-located electrode;
    forming the organic semiconductor layer, after forming the source electrode and the drain electrode, so as to connect the source electrode and the drain electrode to each other by a process of dropping an organic semiconductor material;
    forming a water repellent layer on the source electrode and the drain electrode formed by the electrode forming process;
    forming a protection layer on the substrate with the organic semiconductor layer;
    removing the water repellent layer; and
    forming a contact hole which pierces through the protection layer.

15. A method according to claim 14, wherein the dropping process in the organic semiconductor layer forming process is an ink jet process.

16. A method according to claim 14, wherein one drop is applied in the dropping process.

17. A method according to claim 14, wherein the inner circumference of the outer-located electrode is of a same shape as that of the outer circumference of the inner-located electrode.

18. The method of claim 14, wherein the inner-located electrode is positioned nearer to a surface of the substrate than the outer-located electrode as measured along a direction perpendicular to the surface.

19. The method of claim 18, wherein the outer-located electrode overlaps the inner-located electrode and the surface.

20. The method of claim 19, wherein the inner-located electrode overlaps the surface.

21. The method of claim 14, wherein the process of dropping results in the organic semiconductor layer having an even thickness.

22. The method of claim 21, wherein the process of dropping comprises having a drop of the organic semiconductor material land onto a center of the inner-located electrode and then spread radially to reach the outer-located electrode.

23. The method of claim 22, wherein the process of dropping results in the organic semiconductor layer being aligned from an outer rim of the outer-located electrode to the center of the inner-located electrode and along a direction of alignment that matches a direction of a channel width of the organic thin film transistor.

24. The method of claim 21, wherein the process of dropping results in the organic semiconductor layer being aligned along a direction of alignment that matches a direction of a channel width of the organic thin film transistor.

25. The method of claim 14, wherein the process of dropping results in the organic semiconductor layer being aligned along a direction of alignment that matches a direction of a channel width of the organic thin film transistor.

26. The method of claim 14, wherein the process of dropping results in the organic semiconductor layer being aligned from an outer rim of the outer-located electrode to the center of the inner-located electrode and along a direction of alignment that matches a direction of a channel width of the organic thin film transistor.

* * * * *

UNITED STATES PATENT AND TRADEMARK OFFICE
CERTIFICATE OF CORRECTION

| | | |
|---|---|---|
| PATENT NO. | : 8,372,686 B2 | Page 1 of 1 |
| APPLICATION NO. | : 11/714059 | |
| DATED | : February 12, 2013 | |
| INVENTOR(S) | : Yamada et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1189 days.

Signed and Sealed this
Thirtieth Day of September, 2014

Michelle K. Lee
*Deputy Director of the United States Patent and Trademark Office*